United States Patent [19]
Diiorio et al.

[11] Patent Number: 5,356,475
[45] Date of Patent: Oct. 18, 1994

[54] CERAMIC SPACER ASSEMBLY FOR ASM PECVD BOAT

[75] Inventors: Salvatore Diiorio, Campbell; Quentin Jackson, Hayward, both of Calif.

[73] Assignee: LSI Logic Corporation, Milpitas, Calif.

[21] Appl. No.: 21,009

[22] Filed: Feb. 22, 1993

[51] Int. Cl.⁵ .............................................. C23C 16/50
[52] U.S. Cl. ................................. 118/723 E; 118/715
[58] Field of Search ............ 118/723 E, 723 ER, 728, 118/715; 156/345

[56] References Cited

U.S. PATENT DOCUMENTS

| | | | |
|---|---|---|---|
| 4,223,048 | 9/1980 | Engle, Jr. ..................... | 118/723 E X |
| 4,491,606 | 1/1985 | Plosler et al. ................ | 118/723 E X |
| 4,633,051 | 12/1986 | Olson .......................... | 118/725 X |
| 4,761,301 | 8/1988 | Ellenberger et al. ........ | 118/723 E X |

*Primary Examiner*—R. Bruce Breneman
*Assistant Examiner*—Jonathan D. Baskin
*Attorney, Agent, or Firm*—Poms, Smith, Lande & Rose

[57] ABSTRACT

A method and apparatus for eliminating radio frequency arcing in a wafer coating plasma process, called PECVD, is disclosed. In the PECVD process, semiconductor wafers are mounted on graphite paddles of a boat assembly held inside a furnace tube. The graphite paddles are arranged in parallel planes and held in a spaced apart relationship by ceramic rods. The present invention spacers have small diameter end portions and are disposed coaxially on the ceramic rods. The spacers support the graphite paddles only on the small diameter end portions, thus separating the graphite paddles from the ceramic rods, as well as simultaneously maintaining the spacing between adjacent graphite paddles on a common ceramic rod. An optional end spacer is disposed on the end of the ceramic rod and is held in place by an optional ceramic nut screwed onto threads formed on the end of the ceramic rod. The nut compresses the end spacer against the graphite paddle thereby pushing together the entire sequence of alternating graphite paddles and spacers on the common ceramic rod. An alternative embodiment spacer having a flange can also be used to separate the graphite paddle from the ceramic rod and is used in conjunction with conventional spacers.

10 Claims, 3 Drawing Sheets

CERAMIC SPACER ASSEMBLY FOR ASM PECVD BOAT

BACKGROUND OF THE INVENTION

1. Field of the Invention

The present invention relates to a method and apparatus for processing microelectronic wafers. More precisely, the present invention relates to a method and apparatus for eliminating radio frequency arcing in a wafer coating plasma process.

2. Description of the Prior Art and Related Information

Semiconductor wafers containing microcircuits and dice are often coated with various types of film for specific desired purposes. Plasma Enhanced Chemical Vapor Deposition (PECVD) is such a process. It involves coating a wafer with a solid film of chemical substances generated from gaseous reactants through what is termed in the art as a radio frequency glow discharge. The PECVD coating process is carried out by suspending the wafers in a boat assembly that is, in turn, enclosed in a furnace tube (also called a quartz process tube) for processing. The boat assembly comprises a plurality of graphite plates, also known as paddles, arranged in parallel planes and separated by ceramic rods passing through the planes at about a right angle thereto. Wafer support pins are located on the graphite paddles and the wafers to be coated are suspended on the wafer support pins.

Graphite paddles are arranged on each ceramic shaft in a spaced apart relationship. Conventional ceramic spacers are mounted coaxially on the ceramic rod to separate adjacent graphite paddles from each other. Importantly, the spacers have a constant diameter for the entire length thereof, and do not pass through the graphite paddles.

As mentioned above, the boat assembly adopted for carrying the wafers is centered within the furnace or quartz process tube. The tube is enclosed in a resistance type heating element. Next, the chamber holding the boat assembly is evacuated to operating pressure and reacting gases are injected through the load/unload end part of the chamber. Vacuum integrity is maintained by use of a closed loop vacuum system that constantly monitors internal tube pressure. A radio frequency generator applies radio frequency energy to the boat assembly. Specifically, radio frequency power is applied to alternate plates in the boat assembly, thereby producing a plasma field. The RF power is applied only when the process variables such as pressure, temperature, and gas flow are stabilized. Usually, the PECVD process is carried out at low wafer processing temperatures from 40 to 650 degrees Celsius, due to the reaction being sustained by the plasma. The wafer is heated to assure film adhesion and desired characteristics. Reactions are typically carried out at pressures of 0.5 to 2 Torr.

Generally, all process functions are continuously monitored and controlled by a microprocessor. The microprocessor also monitors all safety interlocks and brings the process to a safe condition should an interruption or malfunction occur. As is commonly known in the art, the interlocks ensure that, for example, all seals on the furnace are tight, doors are secure, ambient pressures are equalized, etc.

A problem that exists with respect to conventional boat assemblies is that the structure is subject to "arcing" when RF energy is applied to the paddles. The arcing causes a short circuit during the process, which leads to defects in the deposited film. The cause of the arcing has been linked to graphite build-up on the ceramic rods that support the graphite paddles. During assembly and disassembly, when the paddles are slid over the ceramic shaft, the graphite buildup is scraped and graphite particles subsequently deposit on the outside diameter of the ceramic rods. The graphite acts as a conductor and when the RF energy is applied and the deposited graphite produces a short between the paddles. This arcing can result in increased manufacturing costs, loss of die on the silicon wafer, increased labor and downtime in the preparation of the boat assembly. Thus, a need presently exists for rectifying this arcing problem.

SUMMARY OF THE INVENTION

Therefore, in view of the foregoing, it is an object of the present invention to provide a method and apparatus for eliminating radio frequency arcing in a wafer coating plasma process.

It is a further object of the present invention to provide an apparatus for inhibiting the undesired removal of graphite from the graphite paddles as well as the depositing or accumulating of the removed graphite on the ceramic rods on which the paddles are supported.

It is yet another object of the present invention to simplify assembly and to improve reliability of the boat assembly.

Yet another object of the present invention is to assure self-alignment of the paddles on the ceramic rods during the assembly. Still yet another object of the present invention to improve electrical isolation of the graphite paddles on which the wafers to be coated are mounted. Other objects and advantages will become apparent after a reading of the following description.

To overcome the above discussed obstacles and achieve the aforementioned objects there is provided an apparatus adopted to inhibit the RF arcing phenomenon that occurs in conventional boat assemblies. The present invention provides a spacer structure that separates the graphite paddle from the supporting ceramic rod. In a preferred embodiment of the present invention, the spacer structure is comprised of ceramic and is mounted coaxially over the ceramic rod. The ceramic spacer structure includes a small diameter end portion that is designed to pass into a mounting opening provided in the graphite paddle. Once assembled, the small diameter end portion of the ceramic spacer fits into the mounting opening of the graphite paddle, while the ceramic rod passes centrally through the spacer and is thus separated from the graphite paddle by the ceramic spacer structure.

The ceramic spacer structure comprises an overall diameter that is greater than the diameter of the small diameter end portion and the size of the mounting opening of the graphite paddle. Accordingly, the ceramic spacer structure engages the graphite paddle only along the length of the small diameter end portion. By virtue of the larger overall diameter of the ceramic spacer structure, it is prevented from sliding through the mounting opening of the graphite paddle. When a plurality of graphite paddles and ceramic spacers are alternately mounted on a common ceramic rod, the spacers support each graphite paddle on its smaller diameter end portion and substantially maintain the graphite paddles in a spaced apart relationship.

In an alternative embodiment, a ceramic spacer structure which is located near an end of the ceramic rod further comprises a flange that abuts the outermost graphite paddle in order to prevent outward movement of the paddle and undesired loss of graphite. In still another embodiment, threads are formed on an end of the ceramic rod to allow a ceramic nut to be threaded thereon such that the ceramic nut abuts the flanged spacer, which in turn engages the graphite paddle so that the graphite paddle will then compress against an intervening spacer. Accordingly, the alternating graphite paddles and spacer structure are locked into position on a common ceramic rod by advancement of the ceramic nut onto the threads of the ceramic rod.

In yet another alternative embodiment, a spacer having a flanged end is employed in conjunction with the conventional spacers, mentioned above, which have a single constant diameter for the entire length of the spacer. This alternative embodiment spacer fits coaxially over the ceramic rod to separate the graphite paddle from the rod, yet the flange keeps the spacer from sliding through the mounting opening.

BRIEF DESCRIPTION OF THE DRAWINGS

The objects, features and advantages of the present invention will be apparent to one skilled in the art from reading the following detailed description in which.

DETAILED DESCRIPTION OF THE INVENTION

The following specification describes a method and apparatus for eliminating radio frequency arcing in a wafer coating plasma process. In the description, specific materials and configurations are set forth in order to provide a more complete understanding of the present invention. It will be understood, however, that the present invention can be practiced without those specific details. In some instances, well-known elements are not described in more detail so as not to obscure certain aspects of the present invention.

The present invention provides an apparatus and method for eliminating radio frequency arcing in a wafer coating plasma process. The process involves a furnace tube into which radio frequency energy and reactant gases are introduced. The furnace encloses a boat assembly comprising graphite paddles arranged in parallel planes and held in a spaced apart relationship by ceramic rods. Semiconductor wafers to be coated in this process are disposed onto those graphite paddles.

Figure 1:
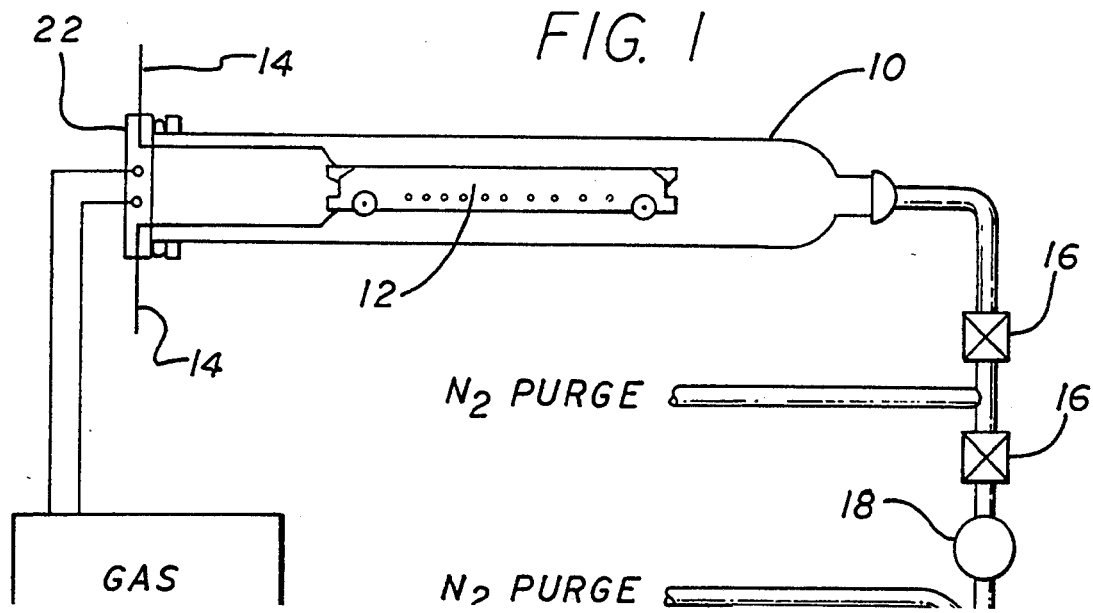
FIG. 1 provides a schematic view of the furnace tube and associated hardware.

FIG. 1 provides a schematic view of the general arrangement of the process, known in the art as PECVD, Used in this process is a furnace tube 10 that encloses a boat assembly 12 therein. At one end of the furnace tube 10 are valves 16 and pumps 18 to control gas evacuation from the interior of the furnace tube 10. The evacuated gas is vented through a vent 20. Nitrogen gas is purged from the interior of the furnace tube 10 as well as other gases as will be appreciated by those skilled in the art.

Reactant gases are then released into the furnace tube 10. A pressure sensor 22 is provided at an opposite end of the furnace tube 10 to constantly monitor interior pressure. RF conductor leads 14 are connected to the boat assembly 12, which holds the semiconductor wafers.

Figure 2:
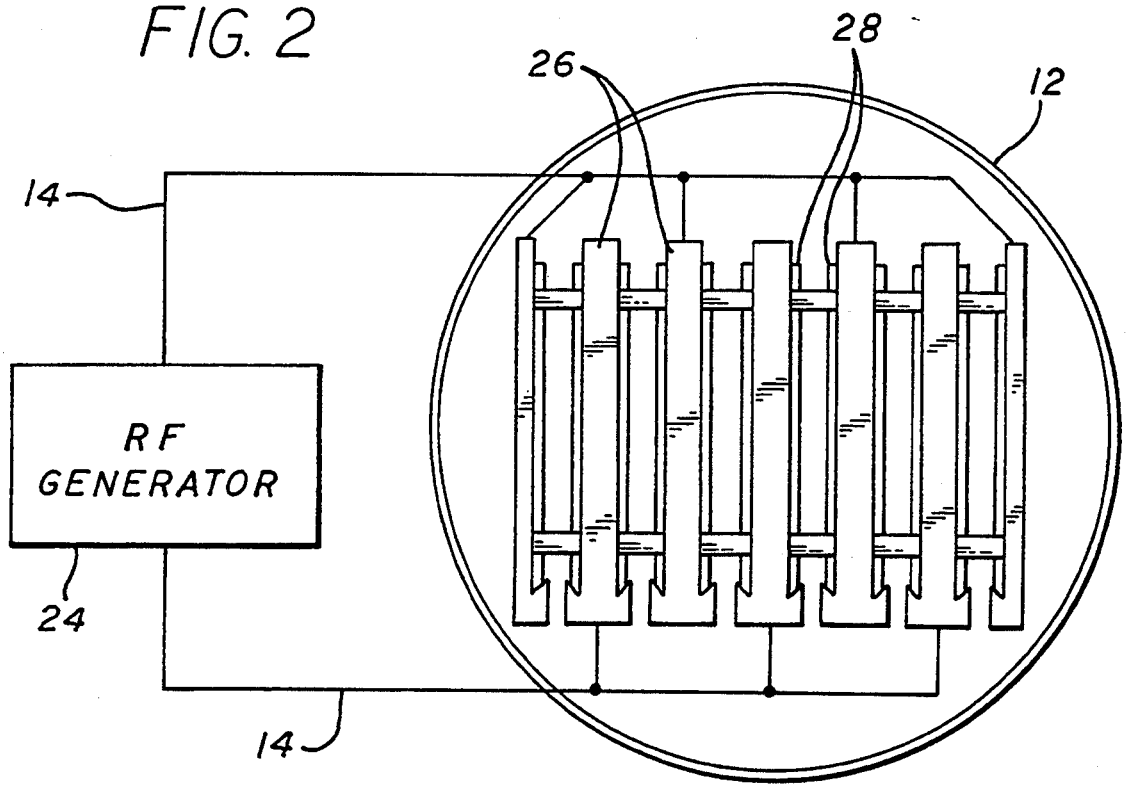
FIG. 2 provides a schematic view of a boat assembly relative to an RF generator.

FIG. 2 provides a schematic view of the electrical aspects of the process. As shown here, the boat assembly 12 comprises a plurality of graphite paddles 26. The graphite paddles 26, are disposed in parallel planes. As the name indicates, the graphite paddles 26 are comprised of graphite and shaped into panels or paddles. The paddles are used as insulators between the silicon wafers. Semi conductor wafers to be coated with a film in the present process are mounted to either side of the graphite paddles 26. An RF generator 24 connected via conductor leads 14 applies RF energy to alternate graphite paddles 26 and applies RF energy thereto. After the furnace tube 10 is evacuated and then filled with reactant gas, and the furnace chamber environment settles at the proper ambient temperature, RF energy is applied to generate plasma. The process is usually carried out at temperatures ranging from 40 degrees to 650 degrees Celsius, while the ambient pressure ranges from 0.5 to 2 Torr. The process is known in the art and need not be described in further detail herein.

Figure 3:
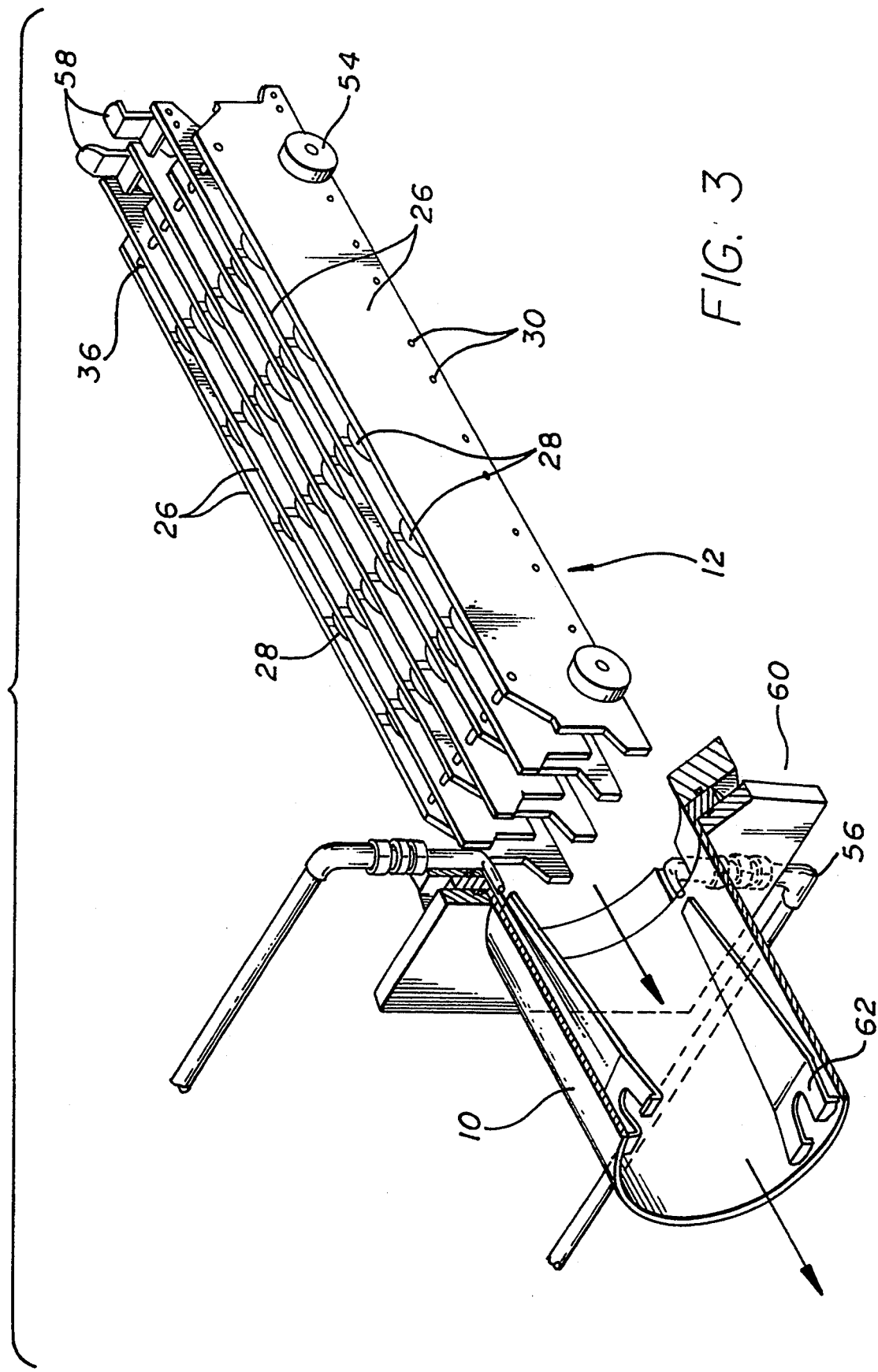
FIG. 3 provides a perspective view of the boat assembly prior to insertion in the furnace tube.

FIG. 3 provides a perspective view of a boat assembly 12 before insertion inside the furnace tube 10. FIG. 3 illustrates how the graphite paddles 26 are arranged in parallel planes and held in a spaced apart relationship by rods 36 extending in a direction substantially perpendicular to the parallel planes of the graphite paddles. In the preferred embodiment, the rods 36 are made from a ceramic material. Additionally, the graphite paddles 26 include wafer support pins 30 to which are mounted the semiconductor wafers 28.

As seen in FIG. 3, the boat assembly 12 is mounted on rollers 54 that facilitate insertion and withdrawal of the boat assembly 12 into and out of the furnace tube 10. This allows the boat assembly 12 to be loaded and unloaded with semiconductor wafers 28 after each coating cycle. The boat assembly 12 passes through a furnace face plate 60 having an opening leading to the interior. Inside the furnace tube 10, furnace contacts 62 make contact with the boat contacts 58 to electrically connect the graphite paddles 26 within the boat assembly 12 to the RF generator 24, located outside of the furnace tube 10. Conductor cables 56 route the electrical leads out from the furnace contacts 62 to the RF generator 24 and back. Once the boat assembly 12 is loaded into the furnace tube 10 and sealed inside, the process proceeds as discussed above.

In a conventional boat assembly, frequent assembly and disassembly of the graphite paddles 26 and the ceramic rods 36 cause graphite to wear off of the former and to accumulate on the latter. After the source of the problem was discovered, in order to avoid accumulation of graphite on the ceramic rods 36, applicants provided a spacer structure 32 that separated the graphite paddles 26 from the ceramic rods 36.

Figure 4:
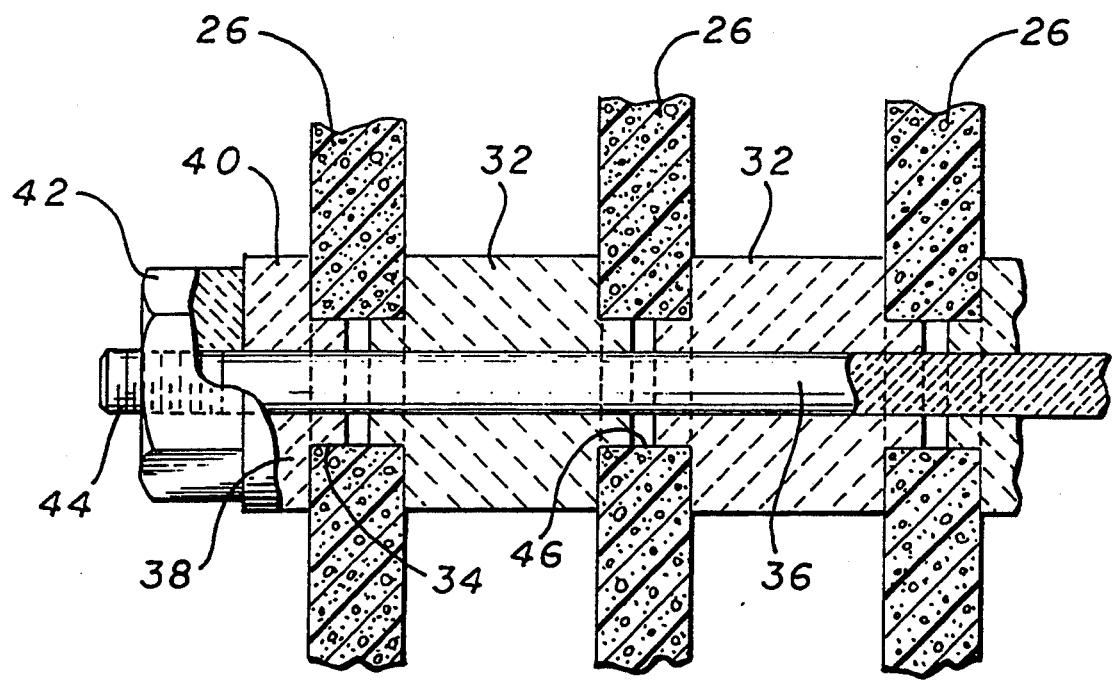
FIG. 4 provides a partial cross-sectional view of the present invention spacer utilized in a boat assembly.

In FIG. 4, there is shown a preferred embodiment of the present invention. Spacer structure 32 is disposed in a coaxial relationship over a ceramic rod 36. The spacer is preferably made from a ceramic material. Notably, the present invention spacer has at least two diameters.

In particular, at opposite ends of the ceramic spacer 32 are end portions 34 which have a diameter that is smaller than the a diameter of the main portion of the spacer between the end portions 34. These smaller diameter end portions 34 have a diameter that is adapted to fit into the mounting openings 46 formed in the graphite paddles 26. Because the ceramic spacers 32 have an outside diameter that is larger than the size of the openings 46, the ceramic spacer 32 cannot pass through the opening 46. Hence, the graphite paddles 26 are generally supported only on the small diameter end portions 34 of the ceramic spacers 32. With the aforementioned structure, the ceramic spacer 32 supports the graphite paddles 26 on the ceramic rod 36 while simultaneously separating the latter two structures.

Also, the ceramic spacer 32 separates adjacent graphite paddles 26 because the larger outside diameter of the spacer 32 prevents the graphite paddles 26 from sliding past the small diameter end portion 34 onto the rest of the length of the spacer 32. In this manner, adjacent graphite paddles 26 as shown in FIG. 4 are kept apart.

In view of the fact that the graphite paddles 26 are supported on only the small diameter end portion 34 of the ceramic spacer 32 and there is no contact with the ceramic rod 36, the opportunity for graphite removed from the paddles 26 to deposit or accumulate on the ceramic rods 36 is greatly reduced if not eliminated. Accordingly, RF arcing caused by graphite accumulation on the ceramic rods 36 is greatly reduced if not eliminated altogether.

The present invention also provides an optional end spacer 38 having a flange 40. As seen in FIG. 4, the end spacer 38 is located at either end of the ceramic rod 36 and is the last spacer of a series of alternating graphite paddles 26 and ceramic spacers 32. The end spacer 38 fits inside the opening 46 while the flange portion 40 engages the outside surface of the graphite paddle 26. If optional threads 44 are formed on the ends of the ceramic rods 36 as shown, and an optional ceramic nut 42 is screwed onto the threads 44, the nut 42 and the end spacer 38 provide a convenient means for retaining the alternating spacers 32 and graphite paddles 26 in a tight arrangement on any common ceramic rod 36. In the preferred embodiment, the end spacer 38 and the assembly nut 42 are made from a ceramic material for insulating purposes.

Figure 5:
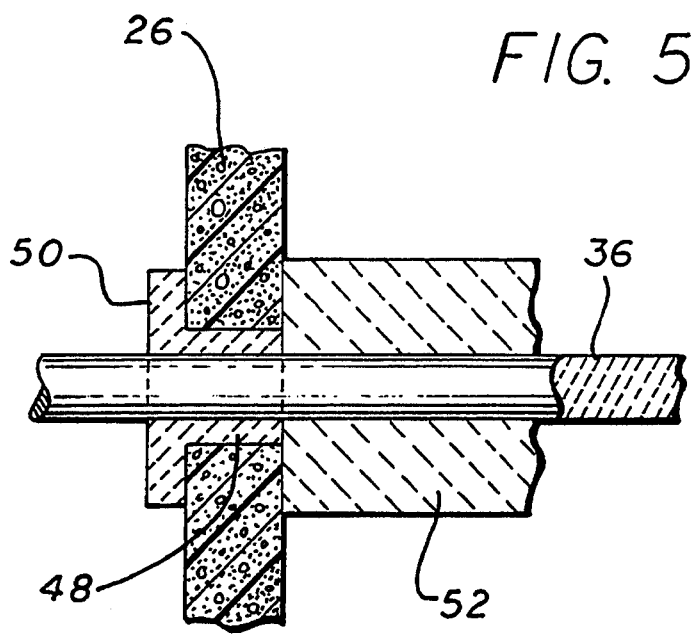
FIG. 5 shows a partial cross-sectional view of an alternative embodiment of the present invention.

FIG. 5 shows a partial cross-sectional view of an alternative embodiment of the present invention. In this alternative embodiment, a spacer 48 having a flange 50 is disposed on the ceramic rod 36. The spacer 48 separates the graphite paddle 26 from the ceramic rod 36 as before. In this alternative embodiment, spacer 48 is used in conjunction with a conventional spacer 52 that keeps two adjacent graphite paddles 26 in a spaced apart relationship on the same ceramic rod 36. Similar to the retaining means mentioned above, the flange 50 of the spacer 48 abuts the outer surface of the graphite paddle 26. Accordingly, if the ceramic rod 36 is threaded and a nut is advanced on the threads, the nut can engage the flange 50 to hold the bushing 48 as well as the alternating sequence of graphite paddles 26 and conventional spacers 52 tightly pushed together on the common ceramic rod 36. As in the preferred embodiment, the alternative embodiment spacer 48 is made from a ceramic material which acts as an insulator.

It will also be appreciated that the above described invention is only one particular embodiment of the invention and that other alternatives will be apparent to those skilled in the art. Accordingly, the present invention is intended to be limited only by the spirit and scope of the appended claims and the equivalence thereof.

What is claimed is:

1. A boat assembly for supporting a wafer in a plasma enhanced chemical vapor deposition (PECVD) apparatus, comprising:
    a support rod having a first diameter;
    a planar electrode which has a hole of a second diameter that is larger than said first diameter formed therethrough and includes structure for supporting said wafer; and
    an electrically insulative, tubular spacer including a bore of said first diameter, a first portion having said second diameter, and a second portion having a third diameter that is larger than said second diameter, in which:
    the rod extends through said bore of said spacer, and said first portion of said spacer fits into said hole of said electrode with said second portion of said spacer abutting against said electrode.

2. A boat assembly as in claim 1, further comprising:
    a planar second electrode having a hole of said second diameter formed therethrough, in which:
    said spacer includes a third portion having said second diameter and which extends from said second portion away from said first portion thereof; and
    said third portion of said spacer fits into said hole of said second electrode with said second portion of said spacer abutting against said second electrode.

3. A boat assembly as in claim 2, in which the structure for supporting said wafer is provided on a surface of said electrode that faces said second electrode.

4. A boat assembly as in claim 2, further comprising a retaining assembly for maintaining said electrode and said second electrode in abutment with said second portion of said spacer.

5. A boat assembly as in claim 4, in which:
    the rod has a threaded portion; and
    the retaining assembly comprises a nut that is threaded onto said threaded portion of the rod and presses said electrode against said second portion of said spacer.

6. A boat assembly as in claim 5, further comprising a flange disposed between said nut and said electrode, the flange including having a bore of said first diameter, a first portion having said second diameter, and a second portion having a fourth diameter that is larger than said second diameter, in which:
    the rod extends through said bore of the flange, and said first portion of the flange fits into said hole of said electrode with said second portion of the flange abutting against said electrode.

7. A boat assembly as in claim 1, further comprising:
    an electrically insulative, tubular second spacer including a bore of said first diameter and having a fourth diameter that is larger than said second diameter, in which:
    the rod extends through said bore of said second spacer, and said spacer and said second spacer abut against opposite surfaces of said electrode.

8. A boat assembly as in claim 7, further comprising a retaining assembly for maintaining said spacer and said second spacer in abutment with said opposite surfaces of said electrode.

9. A boat assembly as in claim 8, in which:
    the rod has a threaded portion; and
    the retaining assembly comprises a nut which is threaded onto said threaded portion of the rod and abuts against said spacer.

10. A boat assembly as in claim 1, in which the electrode comprises graphite.

* * * * *